US008278205B2

(12) United States Patent  (10) Patent No.: US 8,278,205 B2
Matsuoka  (45) Date of Patent: Oct. 2, 2012

(54) SEMICONDUCTOR DEVICE AND METHOD FOR MANUFACTURING THE SAME

(75) Inventor: Takaaki Matsuoka, Minato-ku (JP)

(73) Assignee: Tokyo Electron Limited, Minato-ku (JP)

( * ) Notice: Subject to any disclaimer, the term of this patent is extended or adjusted under 35 U.S.C. 154(b) by 46 days.

(21) Appl. No.: 12/380,368

(22) Filed: Feb. 25, 2009

(65) Prior Publication Data

US 2009/0230558 A1 Sep. 17, 2009

Related U.S. Application Data

(60) Provisional application No. 61/069,244, filed on Mar. 12, 2008.

(51) Int. Cl.
*H01L 21/4763* (2006.01)

(52) U.S. Cl. .. 438/622; 438/627; 438/628; 257/E21.584

(58) Field of Classification Search .................. 438/584, 438/622, 623, 627, 628; 257/E21.584
See application file for complete search history.

(56) References Cited

U.S. PATENT DOCUMENTS

| 6,858,923 | B2 * | 2/2005 | Xia et al. ....................... 257/678 |
| 7,323,781 | B2 * | 1/2008 | Noguchi et al. .............. 257/758 |
| 2005/0245100 | A1 * | 11/2005 | Wu et al. ....................... 438/790 |
| 2006/0046479 | A1 * | 3/2006 | Rajagopalan et al. ........ 438/683 |
| 2008/0290515 | A1 * | 11/2008 | Arunachalam et al. ....... 257/751 |

FOREIGN PATENT DOCUMENTS

JP 2004-071956 3/2004

OTHER PUBLICATIONS

Contents of the Notice for a submission of opinion, KR Patent Application No. 10-2009-0021118, KR Office Action dispatched date; Jan. 19, 2011, issued by KIPO.

* cited by examiner

*Primary Examiner* — Michael Trinh
(74) *Attorney, Agent, or Firm* — Masuvalley and Partners

(57) ABSTRACT

The present invention is a method for manufacturing a semiconductor device having a conductor and an insulating film on a substrate, the method including the steps of forming the conductor on the substrate, forming the insulating film on the conductor, removing the insulating film on the conductor, and blowing an organosilane gas and a hydrogen gas to reduce an oxidized region on the conductor, wherein the oxidized region on the conductor is formed when the insulating film is removed.

15 Claims, 17 Drawing Sheets

SEMICONDUCTOR DEVICE AND METHOD FOR MANUFACTURING THE SAME

This application claims priority from U.S. provisional application Ser. No. 61/069,244, filed Mar. 12, 2008, entitled "Film Forming Method", which is incorporated herein by reference in its entirety.

TECHNICAL FIELD

The present invention relates to a semiconductor device and a method for manufacturing a semiconductor device. In particular, the present invention relates to a method for reducing an interconnection material (conductor) in the method for manufacturing the semiconductor device.

BACKGROUND OF THE INVENTION

As described in Japanese Unexamined Patent Application Publication No. 2004-71956, an exposed copper (Cu) interconnection, which was exposed by an etching step, an ashing step, and a subsequent washing step, can easily be oxidized. Ordinary, as a pretreatment of a step for foaming upper interconnection layers, a reduction treatment is conducted in a state where a substrate is heated using a reducing gas including $NH_3$ and the like or an inactive gas in order to remove the oxidized portion of the copper (Cu) interconnection, or the copper oxide is removed by a sputtering method using argon (Ar) plasma.

However, when a reducing gas and an inert gas are used to conduct the reduction treatment under heating, an interlayer insulating film containing fluorine and carbon as its main elements is damaged. When the sputtering method using argon (Ar) is conducted, the resputtered copper (Cu) is deposited on a side wall of the interlayer insulating film, which results in deteriorating the characteristic of a device. In addition, argon (Ar) has a low energy transfer efficiency against copper (Cu), therefore, the copper oxide (CuO or $CU_2O$) cannot be efficiently removed. On the other hand, argon (Ar) has a high energy transfer efficiency against, especially, fluorine and carbon, which structure the interlayer insulating film, therefore, there is such a problem that argon (Ar) damages the interlayer insulating film. In a barrier film forming process which is conducted after the reduction treatment, a sputter (PVD) method is often used. However, the sputter method results in delivering further damage to the side wall of the interlayer insulating film.

From the viewpoint described above, there is the need to develop a reduction treatment method for interconnections which can minimize damage to an interlayer insulating film.

SUMMARY OF THE INVENTION

The present invention relates to a method for manufacturing a semiconductor device (including Dual Damascene method and the like). In the method for manufacturing a semiconductor device, a second interlayer insulating film is formed on a first interlayer insulating film which a conductor is buried therein. In a case via holes and interconnection grooves are formed in around the area, the conductor is normally exposed to air and consequently oxidized. Therefore, a reduction treatment is needed. One of the features of the present invention relates to the reduction treatment, and the present invention is characterized by including a step of blowing an organosilane gas and a hydrogen gas to the oxidized conductor. That is, the present invention is described as follows, for example.

One aspect of the present invention may be a method of manufacturing a semiconductor device having a conductor and an insulating film on a substrate, the method including the steps of forming the conductor on the substrate and the insulating film on the conductor, removing the insulating film on the conductor and blowing an organosilane gas and a hydrogen gas to reduce an oxidized region on the conductor.

When a semiconductor device is manufactured by the method described above, it is possible to reduce the oxidized interconnection while minimizing damage to a side wall of the interlayer insulating film and the like in via holes and interconnection grooves. In particular, in a case a fluorocarbon film is used as the interlayer insulating film, the method described above is more effective because the fluorocarbon film has a poor resistance to the damage caused by the reduction treatment. By minimizing the damage to the interlayer insulating film, the adhesiveness between the conductor and the interlayer insulating film can also be improved, thereby enabling to manufacture a highly reliable semiconductor device.

The blowing step may further include a step of exciting the organosilane gas and the hydrogen gas by applying a microwave thereto. This means can be applied to the method for manufacturing a semiconductor. For example, even though the reduction treatment should be conducted at low temperature, exciting gases by the microwave can effectively reduce the oxidized part of the interconnection material. This means is also effective when an interlayer insulating film which is sensitive to heat is used, for example.

The blowing step may be to blow the organosilane gas and the hydrogen gas after raising temperature of the substrate within a range from 150 to 350 degrees Celsius. By applying this means to the method for manufacturing a semiconductor, it is possible to reduce the oxidized part more effectively compared with another case in which the organosilane gas and the hydrogen gas are just blown to the oxidized part of the interconnection material.

The blowing step may be to blow the organosilane gas and the hydrogen gas after raising temperature of the substrate within a range from 150 to 300 degrees Celsius. By applying this means to the method for manufacturing a semiconductor, it is possible to reduce the oxidized part more effectively compared with another case in which the organosilane gas and the hydrogen gas are just blown to the oxidized part of the interconnection material.

The organosilane gas may be a methylsilane gas ($Si(CH_3)_x$). The organosilane gas may be a monomethylsilane gas, a dimethylsilane gas, a trimethylsilane gas, or a tetramethylsilane gas and the like. The blowing step may include the step of blowing the hydrogen gas after blowing the organosilane gas. The conductor may be formed by a material including copper. The insulating film may be a fluorocarbon film or a SiCN film.

Another aspect of the present invention may be a method of manufacturing a semiconductor device having multiple layers of insulating films on a substrate, including the steps of forming a conductor in the multiple layers, removing a part of the multiple layers and reducing an oxidized part of the conductor by blowing an organosilane gas and a hydrogen gas to the oxidized part when the conductor is oxidized by removing the part of the multiple layers or by cleaning the multiple layers.

When a semiconductor device is manufactured by the method described above, it is possible to reduce the oxidized interconnection while minimizing damage to a side wall of the interlayer insulating film and the like in via holes and interconnection grooves. In particular, in a case a fluorocarbon film and the like are used as the interlayer insulating film, the method described above is more effective because the fluorocarbon film has a poor resistance to the damage caused by the reduction treatment. By minimizing the damage to the interlayer insulating film, the adhesiveness between the conductor and the interlayer insulating film can also be improved, thereby enabling to manufacture a highly reliable semiconductor device.

The removing step may include a step of forming an opening through the multiple layers. The method may include the step of forming a barrier layer in the opening after reducing the oxidized part of the conductor. The barrier layer may be formed by a tantalum (Ta) or/and tantalum nitride (TaN). The barrier layer may be formed by a titanium (Ti) or/and titanium nitride (TiN). The method may include the step of forming another conductor in the opening after forming the barrier layer. The multiple layers may be made of two different kinds of insulating films.

Another aspect of the present invention may be a semiconductor device manufactured by using a method including the steps of forming an interlayer insulating film in which a conductor is embedded on a substrate, forming an etch stop layer on the conductor and the interlayer insulating film, removing the etch stop layer adjoining the conductor and blowing an organosilane gas and a hydrogen gas to the conductor.

When a semiconductor device is manufactured by the method described above, it is possible to reduce the oxidized interconnection while minimizing damage to a side wall of the interlayer insulating film and the like in via holes and interconnection grooves. In particular, in a case a fluorocarbon film and the like are used as the interlayer insulating film, the method described above is more effective because the fluorocarbon film has a poor resistance to the damage caused by the reduction treatment. By minimizing the damage to the interlayer insulating film, the adhesiveness between the conductor and the interlayer insulating film can also be improved, thereby enabling to manufacture a highly reliable semiconductor device.

The method may include the step of forming another interlayer insulating film on the etch stop layer after forming the etch stop layer. The method may include the step of forming an opening which passes through the interlayer insulating film before removing the etch stop layer.

The blowing step may include a step of exciting the organosilane gas and the hydrogen gas by applying a microwave thereto. By applying this means to the method for manufacturing a semiconductor, it is possible to reduce the oxidized part more effectively compared with another case in which the organosilane gas and the hydrogen gas are just blown to the oxidized part of the interconnection material.

The blowing step may be to blow the organosilane gas and the hydrogen gas after raising temperature of the substrate within a range from 150 to 350 degrees Celsius. By applying this means to the method for manufacturing a semiconductor, it is possible to reduce the oxidized portion more effectively compared with another case in which the organosilane gas and the hydrogen gas are just blown to the oxidized part of the interconnection material.

The organosilane gas may be a trimethylsilane gas.

Another aspect of the present invention may be a method of manufacturing a semiconductor device including a step of forming a plurality of interconnection layers on a substrate, the step including a step of blowing an organosilane gas and a hydrogen gas to a contacting portion between interconnection layers.

The blowing step may further include a step of applying a microwave to the organosilane gas and the hydrogen gas. The blowing step may be to blow the organosilane gas and the hydrogen gas after raising temperature of the substrate within a range from 150 to 350 degrees Celsius.

When a semiconductor device is manufactured by the method described above, it is possible to reduce the oxidized interconnection while minimizing damage to a side wall of the interlayer insulating film and the like in via holes and interconnection grooves. In particular, in a case a fluorocarbon film and the like are used as the interlayer insulating film, the method described above is more effective because the fluorocarbon film has a poor resistance to the damage caused by the reduction treatment. By minimizing the damage to the interlayer insulating film, the adhesiveness between the conductor and the interlayer insulating film can also be improved, thereby enabling to manufacture a highly reliable semiconductor device.

DETAILED DESCRIPTION OF THE INVENTION

Firstly, a method for manufacturing a semiconductor of the present invention will be explained. As the method, for example, conventional Dual Damascene and Single Damascene and the like can be used. Concretely, the method of the present invention includes the following steps.

1) forming a first interlayer insulating film on a substrate, wherein a conductor is embedded in the first interlayer insulating film;

2) forming an etch stop layer on the first interlayer insulating film and the conductor;

3) forming a second interlayer insulating film and a cap layer on the etch stop layer;

4) forming a via hole and an interconnection groove which pass through the second interlayer insulating film and the cap layer;

5) removing the etch stop layer by etching;

6) blowing an organosilane gas and a hydrogen gas to the surface of the conductor exposed externally and side walls of the via hole and the interconnection groove;

7) forming a barrier layer on the side walls of the via hole and the interconnection groove;

8) depositing a conductor on the via hole and the interconnection groove; and 9) grinding the conductor along with the cap layer by CMP so as to leave the conductor only in the via hole and the interconnection groove.

Figure 1:
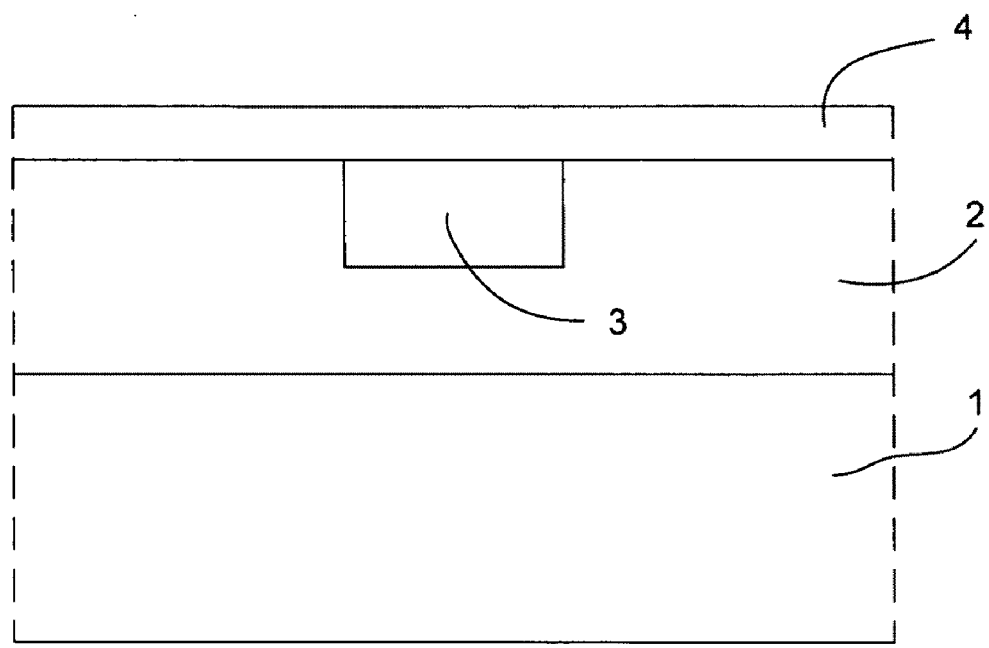
FIG. 1 illustrates one step in the method for manufacturing a semiconductor device according to the present invention.

Hereinafter, each step described above will be concretely described with referent to FIGS. 1 through 9. FIG. 1 illustrates one step in the method for manufacturing a semiconductor device according to the present invention. In FIG. 1, a first interlayer insulating film 2 is formed on a substrate 1, and a conductor 3 is embedded in the first interlayer insulating film 2. Further, an etch stop layer 4 is formed on the first interlayer insulating film 2 and the conductor 3.

For example, CVD (Chemical Vapor Deposition) method can be used to form the first interlayer insulating film 2. When CVD method is used, the first interlayer insulating film 2 may have a thickness of about 100 nm to 300 nm. As the first interlayer insulating film 2, for example, oxide silicon ($SiO_2$), silicon nitride ($Si_xN_y$), SiCN, SiON, SiCOH, $CH_x$, $CF_y$, and the like may be used.

Meanwhile, the conductor is preferably made of a conductive material which includes one or more metal atoms as a major component, for example. Preferably, the conductor includes copper as the major component. When copper is used as the conductor, an interconnection having a low electric resistance can be achieved. As other materials for the conductor, aluminum and the like can also be used. Here, "a major component" may mean the element which makes up not less than about 50% of the conductor when the total of the conductor is defined as 100%. In order to form the conductor 3, a sputter method, an electro plating method, or a nonelectro plating method and the like may be used.

Meanwhile, CVD method can be used to form the etch stop layer 4, for example. As materials for the etch stop layer 4, for example, oxide silicon ($SiO_2$), silicon nitride ($Si_xN_y$), silicon carbide (SiC), SiCN, SiON, SiCO, SiCOH and the like may be used. When SiCN is used as the material for the etch stop layer 4, methane and silane, monomethylsilane (MMS), dimethylsilane (DMS), trimethylsilane (TMS), tetramethylsilane (TMS), silazane and the like are listed as its layer forming gases. The mixture of those gases may also be used. In addition to those gases described above, nitrogen ($N_2$) and ammonia ($NH_3$) and the like may be added to form the layer. The etch stop layer 4 may have a thickness of about 5 nm to 60 nm.

Figure 2:
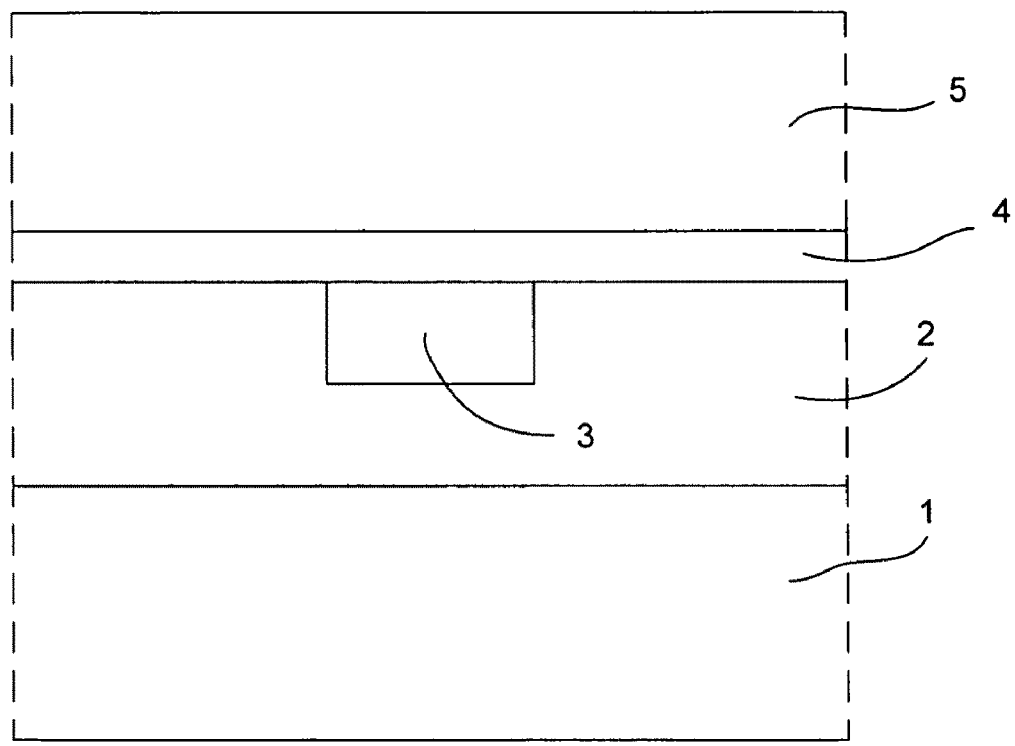
FIG. 2 illustrates one step in the method for manufacturing a semiconductor device according to the present invention.

Next, FIG. 2 will be explained. FIG. 2 illustrates one step in a method for manufacturing a semiconductor according to the present invention. FIG. 2 illustrates a step of forming a second interlayer insulating film 5 further on the etch stop layer 4 explained in FIG. 1.

For example, CVD method and the like may be listed as a method for forming the second interlayer insulating film. For example, oxide silicon ($SiO_2$), silicon nitride ($Si_xCN_y$), SiCN, SiON, SiCOH, $CH_x$, $CF_x$ and the like may be used as the second interlayer insulating film. The second interlayer insulating film is preferably a fluorocarbon film which is made synthetically from carbon atoms (C) and fluorine atoms (F), for example. As used herein, the fluorocarbon film may mean a CF film including carbon atoms and fluorine atoms as its constituents where the ratio of the carbon atoms to the fluorine atoms is about 1:1, for example. In addition, the CF film may include carbon atoms and fluorine atoms which constitute not less than 95% of the film and other constituents which constitute not greater than about 5% of the film.

When the fluorocarbon film is formed as the second interlayer insulating film by CVD method, $C_2F_4$, $C_2F_6$, $C_3F_8$, $C_4F_8$, $C_5F_8$, $C_6H_6$, $CH_2F_2$, $CHF_3$ and the like may be used as a raw material gas (a film forming gas). The formed fluorocarbon film may include hydrogen partly. In this case, either a parallel plate type CVD device or a CVD device using microwave plasma which uses a RLSA (radial line slot antenna) may be used. The second interlayer insulating film has preferably a thickness of 70 nm to 280 nm.

Figure 3:
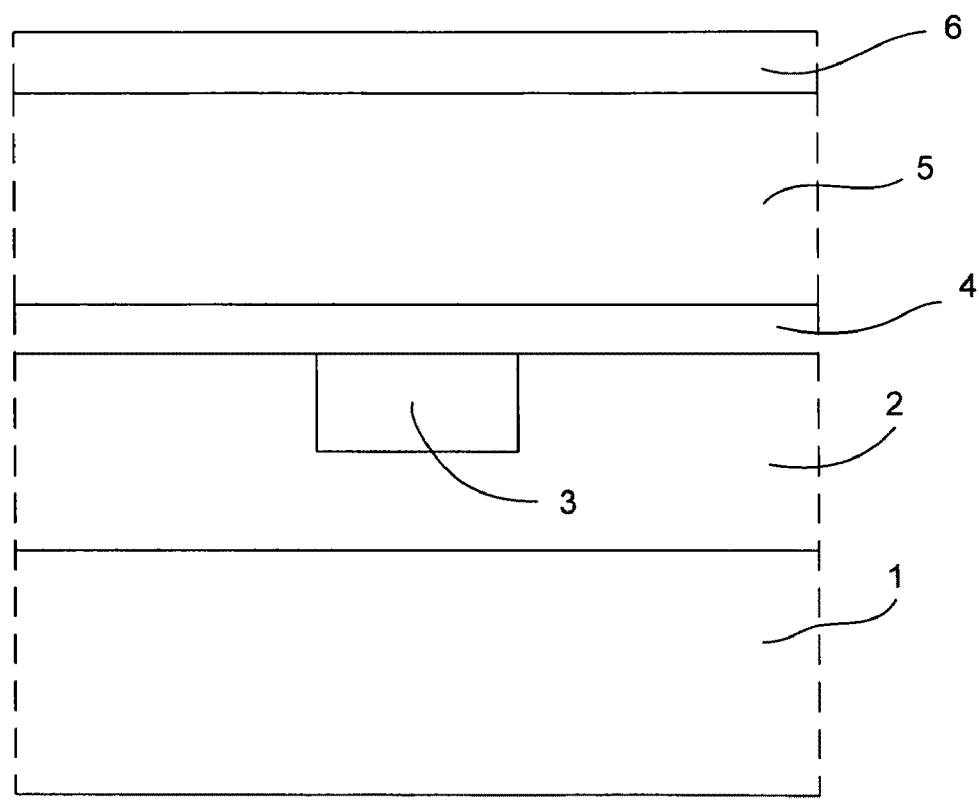
FIG. 3 illustrates one step in the method for manufacturing a semiconductor device according to the present invention.

Next, FIG. 3 will be explained. FIG. 3 illustrates one step in the method for manufacturing a semiconductor device according to the present invention. FIG. 3 illustrates a step of forming a cap layer 6 further on the second interlayer insulating film 5 explained in FIG. 2.

Meanwhile, CVD method may be used as a method for forming the cap layer 6. As materials for the cap payer 6, for example, oxide silicon ($SiO_2$), silicon nitride ($Si_xN_y$), silicon carbide (SiC), SiCN, SiON, SiCO, SiCHO, and the like may be used. When SiCN is used as the material for the cap layer 6, methane and silane, monomethylsilane (MMS), dimethylsilane (DMS), trimethylsilane (TMS), tetramethylsilane (TMS), silazane and the like are listed as the layer forming gas. The mixture of those gases may also be used. In addition to those gases described above, nitrogen ($N_2$) and ammonia ($NH_3$) and the like may be added to form the layer. The cap layer 6 may have a thickness of about 30 nm to 60 nm.

Although, similar materials can be used in forming the etch stop layer 4 and the cap layer 6, it may be allowed to use the same materials or to use different materials each other. The cap layer 6 may be served as a hard mask of the second interlayer insulating film during a patterning process for forming a via hole and an interconnection groove which are discussed below. Further, the cap layer 6 may be served as an etching stopper during a CMP process which is conducted after a conductor is filled in the via hole and the interconnection groove. Furthermore, the cap layer 6 can prevent the conductor from diffusing from an upper surface into the second interlayer insulating film when the conductor is filled.

Figure 4:
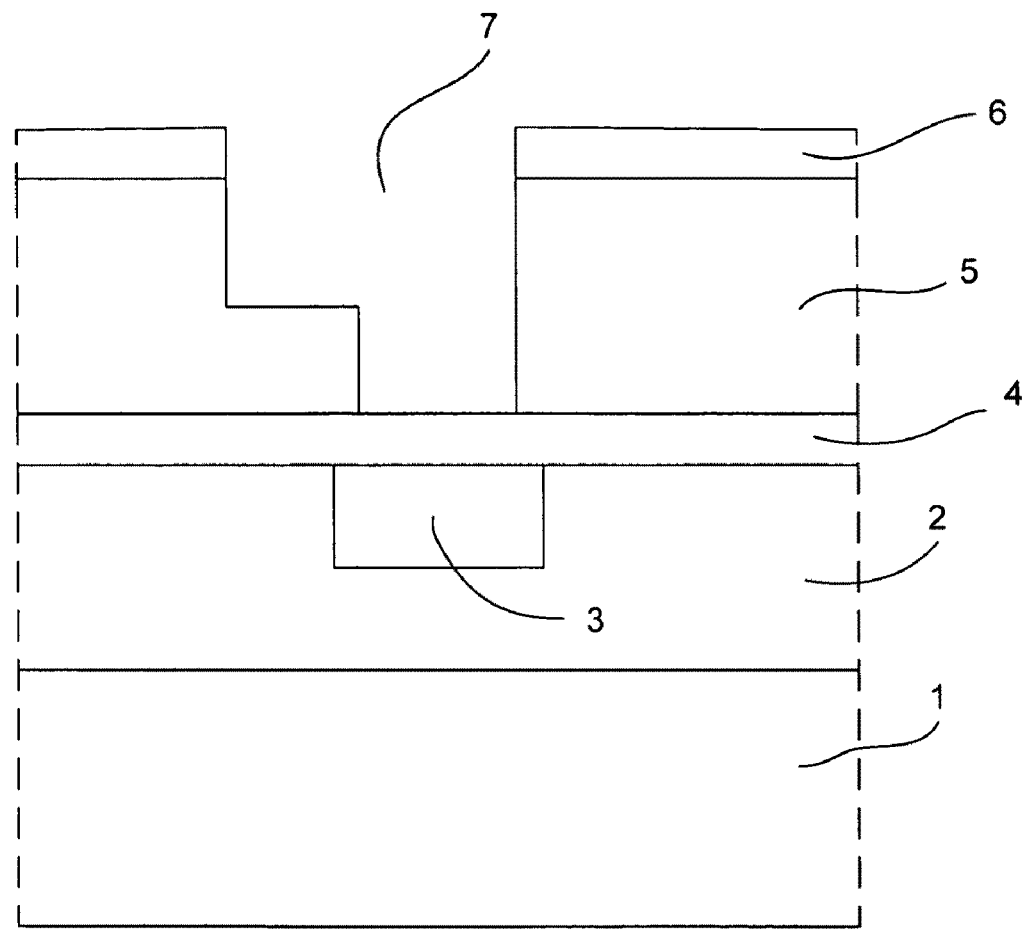
FIG. 4 illustrates one step in the method for manufacturing a semiconductor device according to the present invention.

Next, FIG. 4 will be explained. FIG. 4 illustrates one step in the method for manufacturing a semiconductor device according to the present invention. FIG. 4 illustrates a step of forming a via hole and an interconnection groove 7 which pass through the second interlayer insulating film 5 and the cap layer 6 shown in FIG. 3. In this step, concretely, a mask having an opening at a predetermined region is formed on the cap layer 6. For example, a resist may be used as the mask. Then, the second interlayer insulating film 5 and the cap layer 6 are etched to form the via hole and the interconnection groove 7. The etching process can be conducted by, for example, a wet etching method or a dry etching method.

Figure 5:
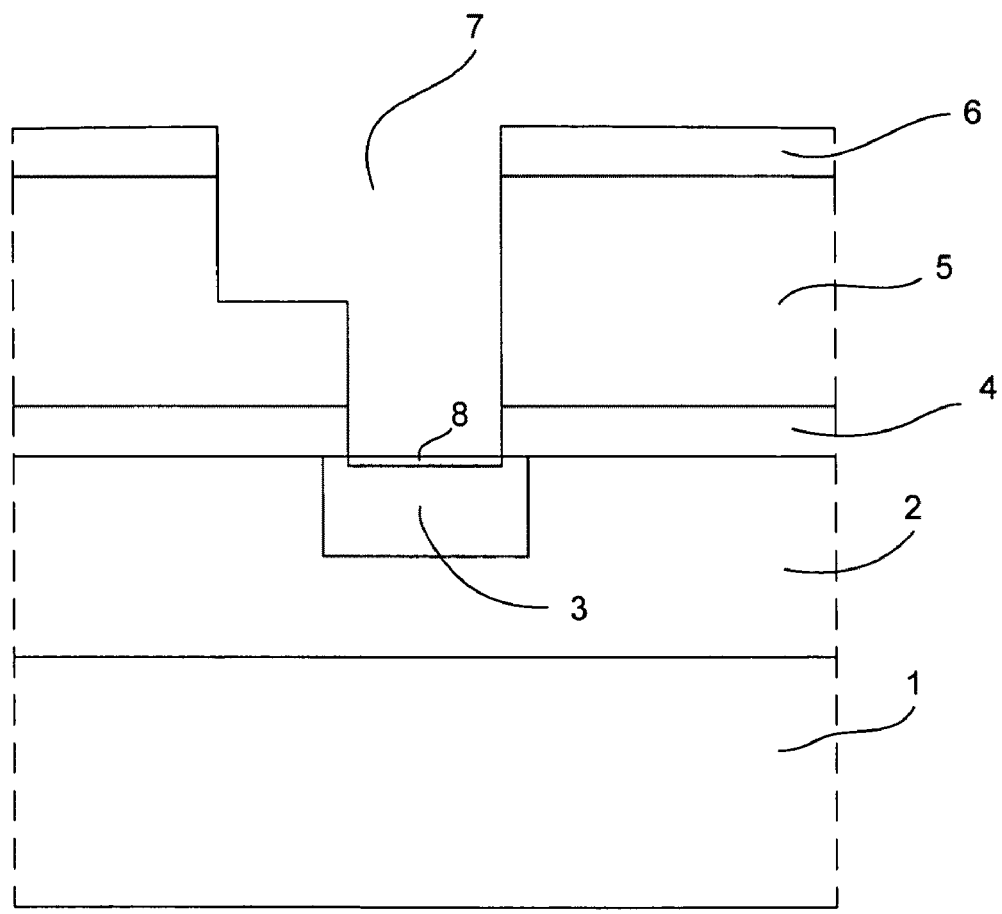
FIG. 5 illustrates one step in the method for manufacturing a semiconductor device according to the present invention.

Next, FIG. 5 will be explained. FIG. 5 illustrates one step in the method for manufacturing a semiconductor device according to the present invention. FIG. 5 illustrates a step of removing the exposed etch stop layer 4 further by an etching process after the via hole and the interconnection groove 7 are formed in FIG. 4. The etching process can be conducted by, for example, a wet etching method or a dry etching method. When this step is conducted, the conductor 3 is externally exposed and exposed to air. Therefore, a part of the surface of the conductor 8 is oxidized, and CuO and $Cu_2O$ are formed.

After the etch stop layer 4 is removed by the etching process, a cleaning step is normally conducted. In this step, the conductor is normally exposed to air. Therefore, a part of the conductor surface 8 is oxidized, and CuO and $Cu_2O$ are formed.

Figure 6:
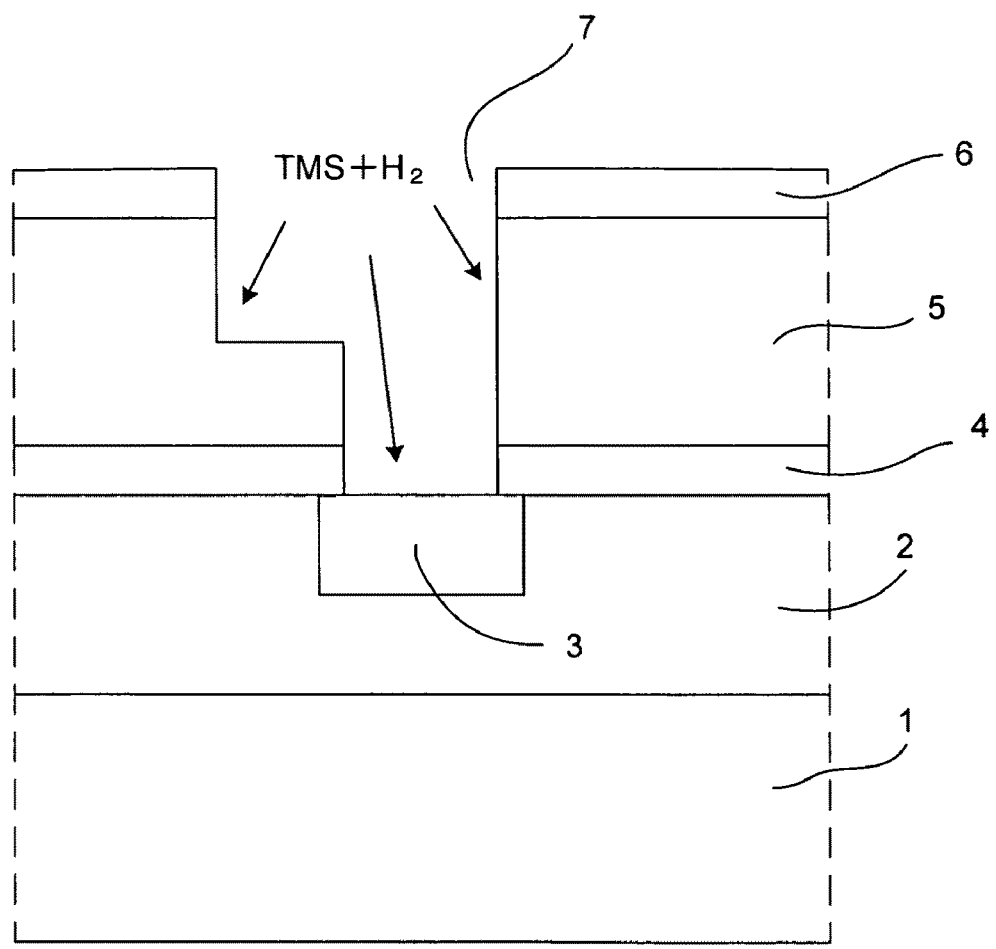
FIG. 6 illustrates one step in the method for manufacturing a semiconductor device according to the present invention.

Next, FIG. 6 will be explained. FIG. 6 illustrates one step in the method for manufacturing a semiconductor device according to the present invention. FIG. 6 illustrates a step of blowing an organosilane gas and a hydrogen gas in the via hole and the interconnection groove formed in the step shown in FIG. 5. Since a part of the surface of the conductor is oxidized in the step shown in FIG. 5, the oxidized part is needed to be reduced. Therefore, this step is conducted.

The second interlayer insulating film 5 having a layered structure usually has a poor resistance to damage. When the conventional reduction treatment is used, the second interlayer insulating film which is exposed in the via hole and the interconnection groove, the side wall of the etch stop layer, and the cap layer can be damaged. However, if the reduction treatment shown in FIG. 6 is conducted, it is possible to completely reduce the oxidized part 8 without damaging the second interlayer insulating film, the side wall of the etch stop layer and the cap layer. Furthermore, when the reduction treatment is conducted by the step shown in FIG. 6, the effect, the second interlayer insulating film can be modified, is achieved. For example, in a case the second interlayer insulating film is a fluorocarbon film, it is thought that $CF_2$ and $CF_3$ in the side wall of the second interlayer insulating film are changed to a C—C bond and a C—$CH_3$ bond by the present reduction treatment, and therefore, the side wall of the second interlayer insulating film is modified. This modification can result in enhancing the adhesiveness and the barrier property.

When the organosilane gas and the hydrogen gas are blown in the via hole and the interconnection groove, the temperature in the via hole and the interconnection groove or the temperature of the substrate may be raised to a predetermined temperature. The predetermined temperature is preferably about 150 to 350 degrees Celsius, and the temperature is more preferably about 150 to 300 degrees Celsius. Conducting the blowing step in a state where the temperature is raised can result in reducing the oxidized part more effectively. It is not preferable to conduct the blowing step in the via hole and the interconnection groove after the predetermined temperature is raised up to over about 350 degrees Celsius, because the risk to deform the conductor (for example, Cu) by the heat is increased. The predetermined temperature is preferably equal to or less than about 300 degrees Celsius. If the blowing treatment is conducted at around 300 degrees Celsius, the adhesiveness of the interlayer insulating film can be further enhanced. On the other hand, when the heat load against the interlayer insulating film is considered, the blowing treatment is preferably conducted at around about 150 to 300 degrees Celsius.

In addition, when the organosilane gas and the hydrogen gas are blown in the via hole and the interconnection groove, either of the organosilane gas or the hydrogen gas, or both of them can be treated in a plasma assist processing. The blowing step including the plasma processing can result in reducing the oxidized part more effectively. The plasma assist processing is usually conducted by introducing the organosilane gas (TMS and the like) after exciting Ar plasma. In a case the interlayer insulating film which is sensitive to heat is used, it is necessary to conduct the reduction process with the blowing step in a state of low temperature. In such a case, the reduction process using the plasma treatment can result in achieving the effective reduction without raising the temperature. When gases are excited into plasma, for example, a parallel plate type plasma generator or a microwave plasma generator using a RLSA (radial line slot antenna) may be used. In a case the microwave plasma generator is used, it is possible to conduct the reduction treatment without damaging as much as possible because the generator can obtain plasmas at low energies.

Meanwhile, the organosilane gas and the hydrogen gas may be blown at the same timing or at the different timing in the via hole and the interconnection grove. For example, the hydrogen gas may be introduced after the organosilane gas is introduced. In this case, for example, the hydrogen gas may be introduced after the organosilane gas is introduced and then about several minutes (about 3 minutes) pass by. Alternatively, the organosilane gas may be introduced after the hydrogen gas is introduced.

The kinds of the organosilane gas which is used in the blowing step may include, but are not limited to, for example, methylsilane (for example, monomethylsilane, dimethylsilane, trimethylsilane, and tetramethylsilane and the like), and silazane (methylsilazane and ethylsilazane and the like), and the like. The use of trimethylsilane is the most effective way. One kind of the organosilane gas may be used, and the mixture of a number of kinds of the organosilane gas may also be used.

Figure 7:
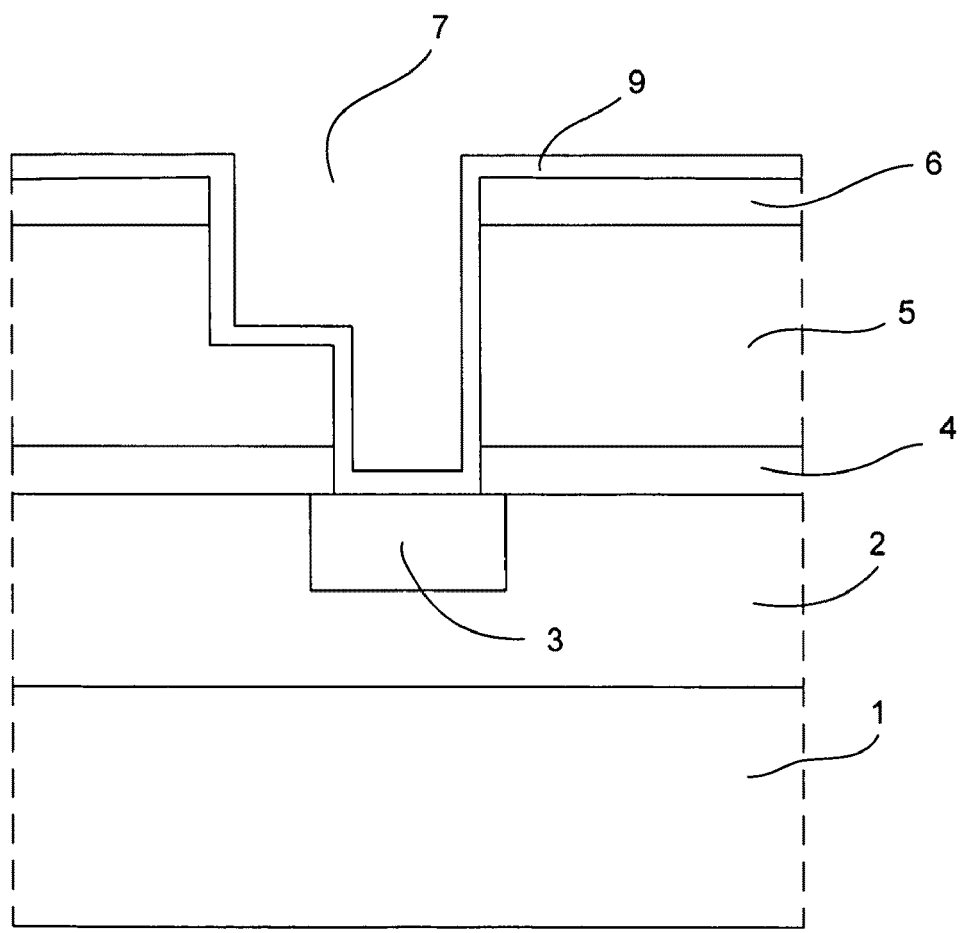
FIG. 7 illustrates one step in the method for manufacturing a semiconductor device according to the present invention.

Next, FIG. 7 will be explained. FIG. 7 illustrates one step in the method for manufacturing a semiconductor according to the present invention. FIG. 7 illustrates a step of forming a barrier layer 9 in the via hole and the interconnection groove after the blowing step shown in FIG. 6 is conducted. Forming the barrier layer 9 may be conducted by a sputter method, for example. Here, the barrier layer is formed along the wall surface of the via hole and the interconnection, and the surface of the cap layer. The barrier layer is formed in the inner wall surface of the via hole and the interconnection groove, and can act as the block to prevent atoms constituting the conductor from intruding into the interlayer insulating film.

Further, the barrier layer serves as a role to enhance the adhesiveness between the conductor and the second interlayer insulating film. Furthermore, the barrier layer can serve as a role to prevent metal materials included in the conductor from diffusing in the second interlayer insulating film. As the barrier layer, high-melting metals or high-melting metal compounds may be used. Concretely, Ta, TaN, Ti, TiN and the like may be used as the barrier layer. The barrier layer preferably has about 3 to 15 nm layer thickness. In addition, the barrier layer may be formed by a single layer or a stacked layer. For example, in a case Ta and TaN are stacked, Ta, which has a high barrier property, is used as an underlayer and TaN, which has a high adhesiveness with Cu is used as an upper layer in order to enable to form the barrier layer which has the high barrier property and the high adhesiveness.

In addition, the barrier layer is a layer including a metal atom. The barrier layer may be structured by only metal atoms, or may include other atoms which are not metal atoms in addition to metal atoms. The barrier layer may include only one kind of metal atom, or may include more than one kind of metal atoms therein. In a case the barrier layer is formed, there is an effect which prevents the conductor (Cu and the like) from diffusing into the interlayer insulating film ($CF_x$ and the like). Furthermore, the barrier layer has other effects which enhance the adhesiveness between the conductor and the interlayer insulating film.

Figure 8:
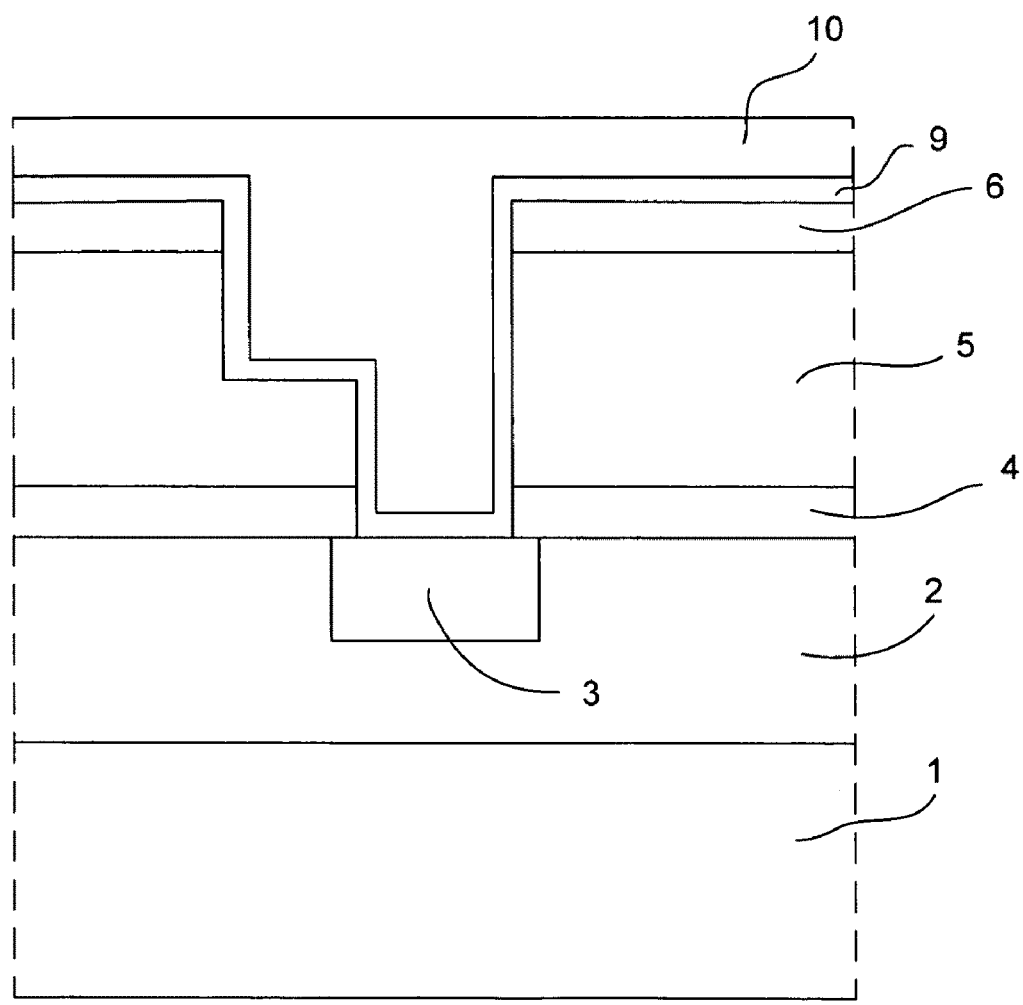
FIG. 8 illustrates one step in the method for manufacturing a semiconductor device according to the present invention.

Next, FIG. 8 will be explained. FIG. 8 illustrates one step in the method for manufacturing a semiconductor according to the present invention. FIG. 8 illustrates a step of introducing a conductor 10 after the barrier layer is formed in the via hole and the interconnection groove. Here, the conductor 10 is formed so as to fill the via hole and the interconnection groove and cover the surface of the barrier layer. Preferably, the conductor includes copper as a major component. When copper is used as the conductor, an interconnection having a low resistance can be achieved. As other materials for the conductor, aluminum and the like may be used. Here, "a major component" may mean the element which makes up not less than about 50% of the conductor when the total of the conductor is defined as 100%. Conventional methods may be used to form the conductor. A sputter method, an electro plating method, or a nonelectro plating method and the like may be used.

Figure 9:
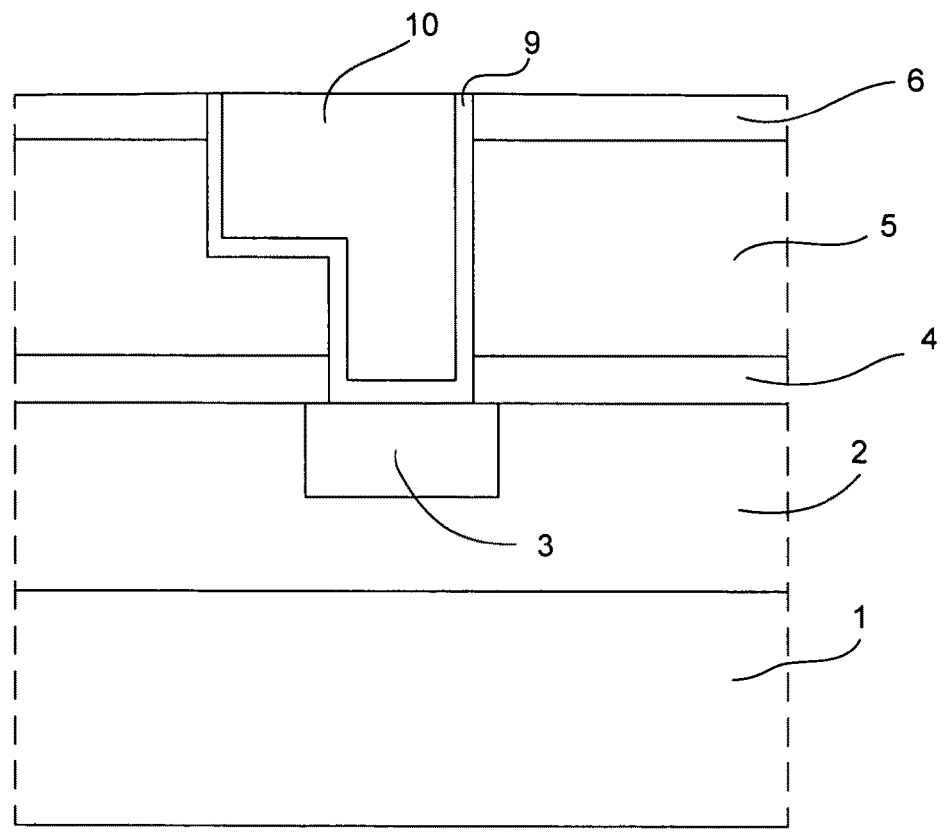
FIG. 9 illustrates one step in the method for manufacturing a semiconductor device according to the present invention.

Next, FIG. 9 will be explained. FIG. 9 illustrates one step in the method for manufacturing a semiconductor according to the present invention. FIG. 9 illustrates a step of removing the conductor and the barrier layer to the extent that the cap layer is exposed to an upper surface after the conductor 10 is introduced. The conductor and the barrier layer may be removed by, for example, CMP (chemical mechanical polishing) method.

Those steps, which include etching, cleaning, blowing, and forming the barrier layer and the like, described above may be conducted using various different devices. In such a case, the conductor can be exposed to air when the substrate with conductor is transferred from one step to another step. Therefore, a part 8 of the surface of the conductor will be easily oxidized to form CuO and $Cu_2O$. Accordingly, from the viewpoint of preventing the conductor surface from being oxidized, it is desired to conduct each step with keeping a vacuum state.

Figure 10:
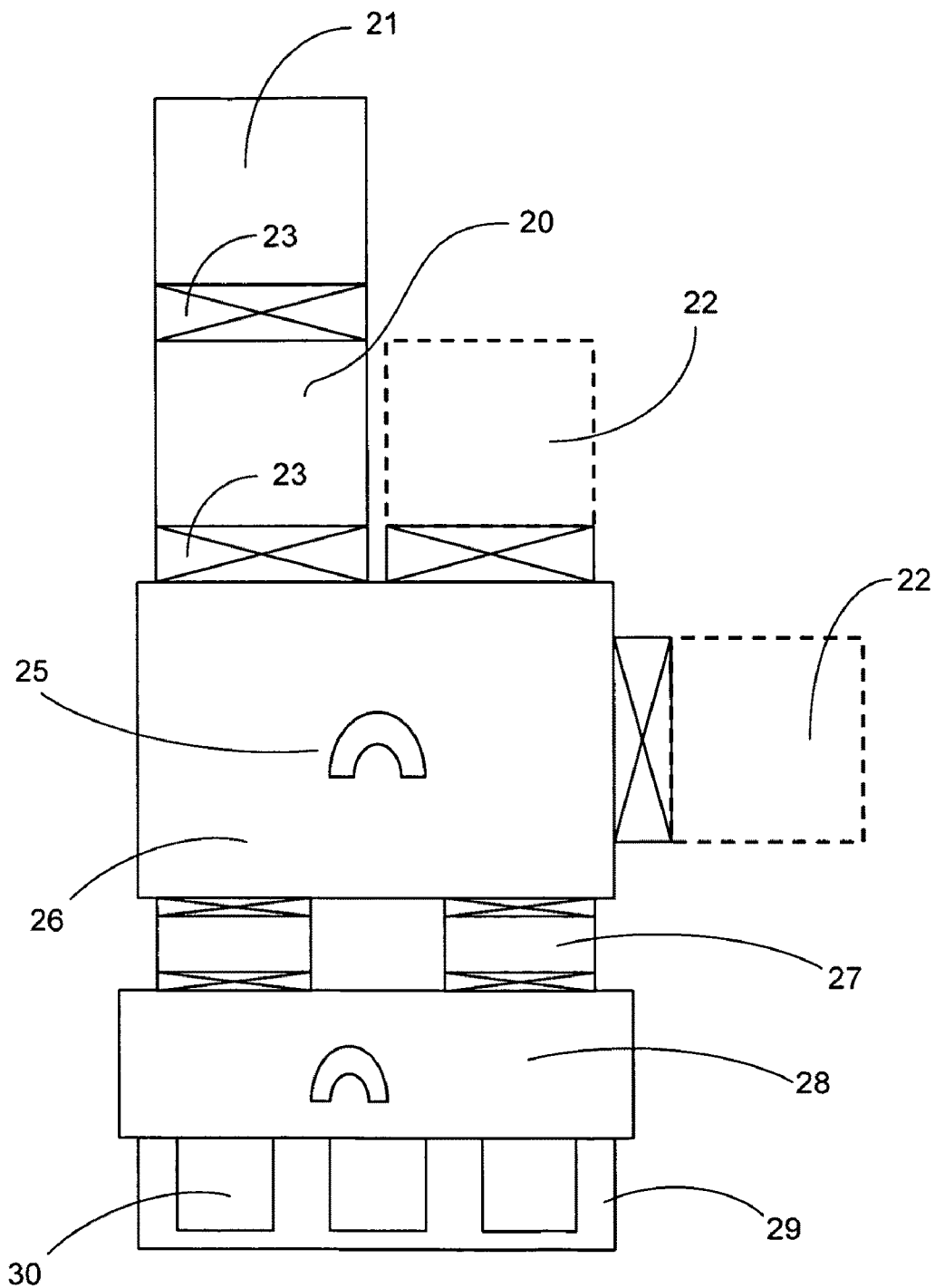
FIG. 10 illustrates a manufacturing device used to produce a semiconductor device according to the present invention.
Figure 11:
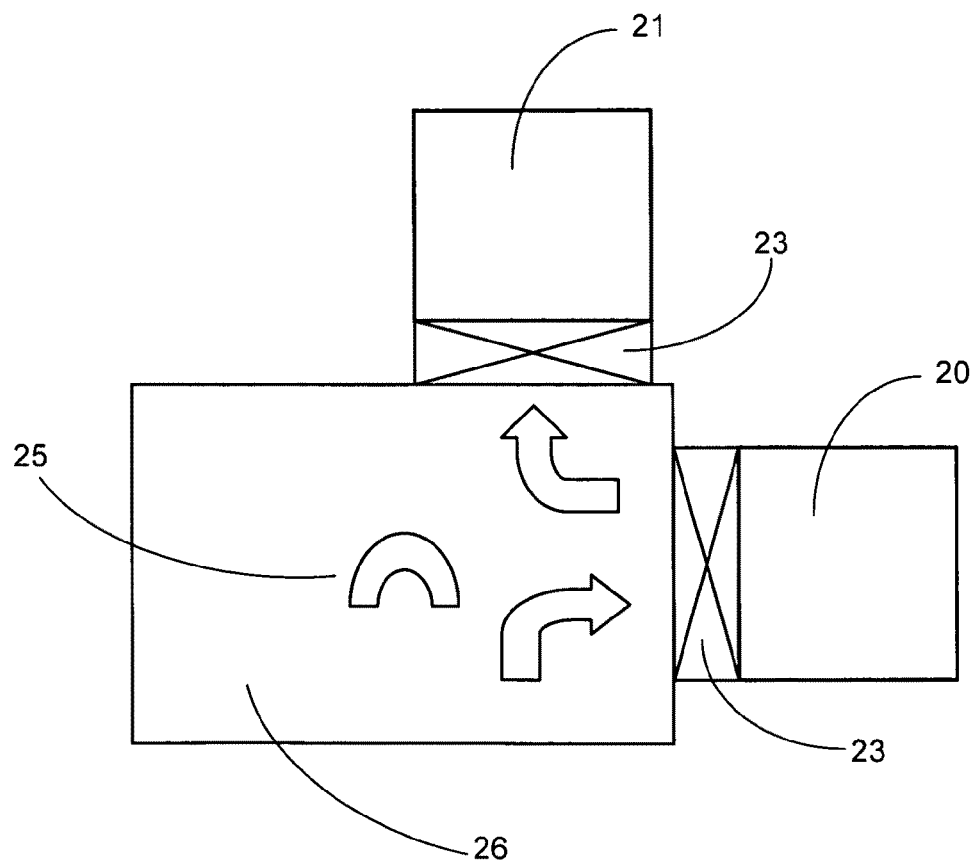
FIG. 11 illustrates another manufacturing device used to produce a semiconductor device according to the present invention.

Concretely, it is possible to prevent the conductor surface from being oxidized by keeping the ambience, in which the substrate exists, in a vacuum state for the blowing step and the barrier layer forming step as shown in FIGS. 10 and 11. Namely, in FIG. 10, a substrate for semiconductor device which is in process of manufacture is consecutively passed through a treatment space 20, which is for conducting the TMS blowing step, and a treatment space 21, which is for conducting the barrier forming step. Accordingly, the exposure of the conductor to air can be prevented by placing the semiconductor device in a vacuum state at all time. An apparatus shown in FIG. 10 comprises an arbitrary vacuum treatment space 22 for conducting a vacuum treatment, a transfer module 26 which constitutes the apparatus, an arm 25, a load lock module 27, a loader module 28, a load port 29, Gate valve 23 and FOUP (Front open unified pod) 30. On the other hand, FIG. 11 illustrates a state where a part of the apparatus shown in FIG. 10 can be changed. FIG. 11 illustrates that after the TMS blowing step is conducted against the semiconductor device which is in process of manufacture in the first space 20, the substrate is transferred through the transfer module which can be controlled in the reduced-pressure atmosphere, and then the barrier layer forming is conducted in the next space 21. The arrows in the FIG. 11 show the order for moving the semiconductor device which is in process of manufacture. FIG. 11 illustrates that firstly, the semiconductor device is transferred to the space 20 and the blowing step is conducted there, and then the barrier layer forming is conducted in the space 21. During the period of conducting those steps, it is desired to transfer the substrate with keeping a vacuum state. Further, as another method, transferring the substrate between the TMS blowing treatment device and the barrier layer forming device within one hour by FOUP can prevent the surface oxidation with keeping the conductor in a vacuum state. In addition, in both FIGS. 10 and 11, any device may be used for forming a vacuum in the apparatus.

As described above, the apparatus for manufacturing the semiconductor device according to the present invention can be manufactured by the steps described above. In addition, by repeating the steps described above, multiple layers of interconnections can be formed, if needed.

Figure 12:
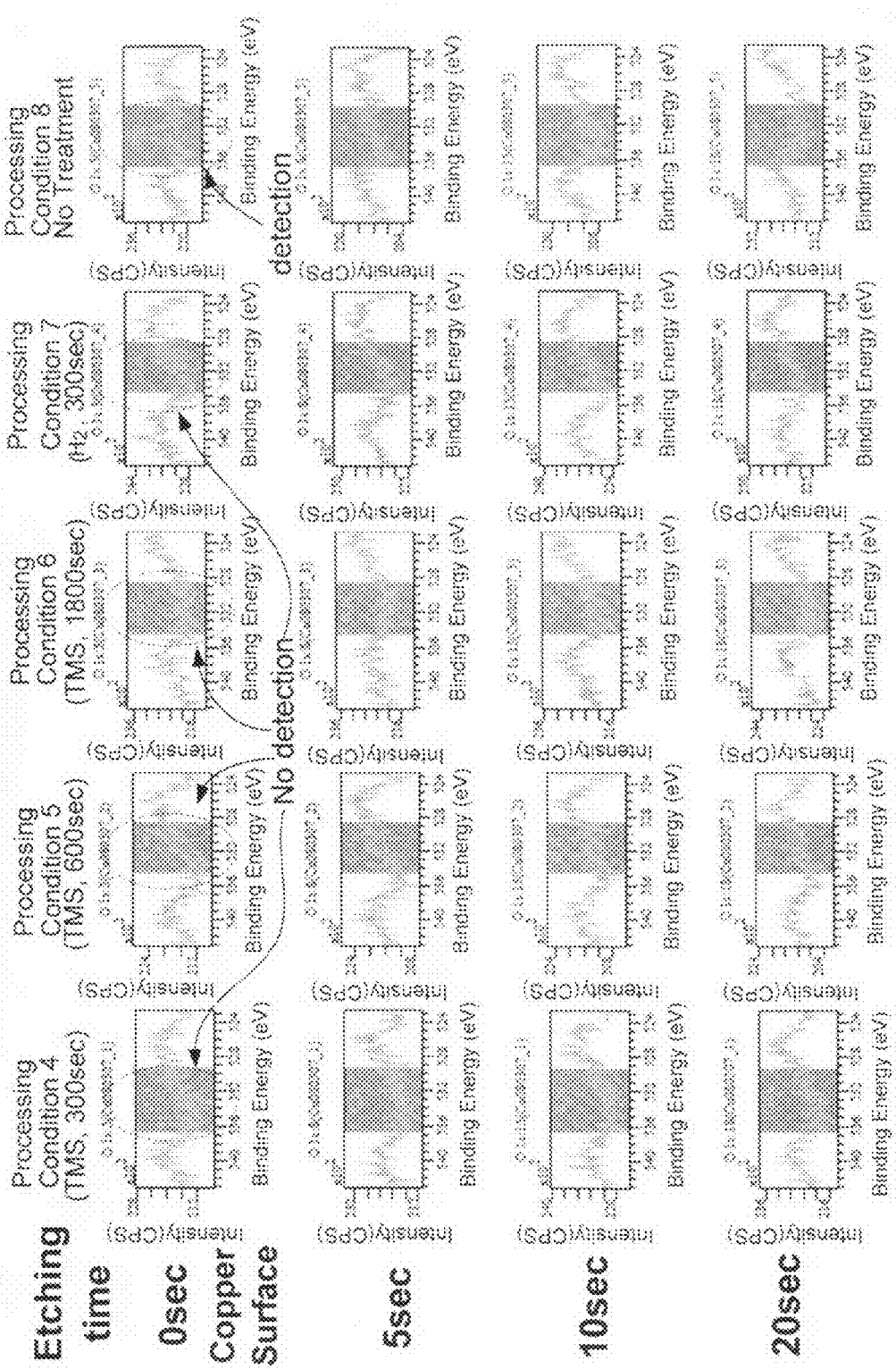
FIG. 12 illustrates results of XPS analysis where a copper oxide to which a reduction treatment was conducted is used as a sample.
Figure 13:
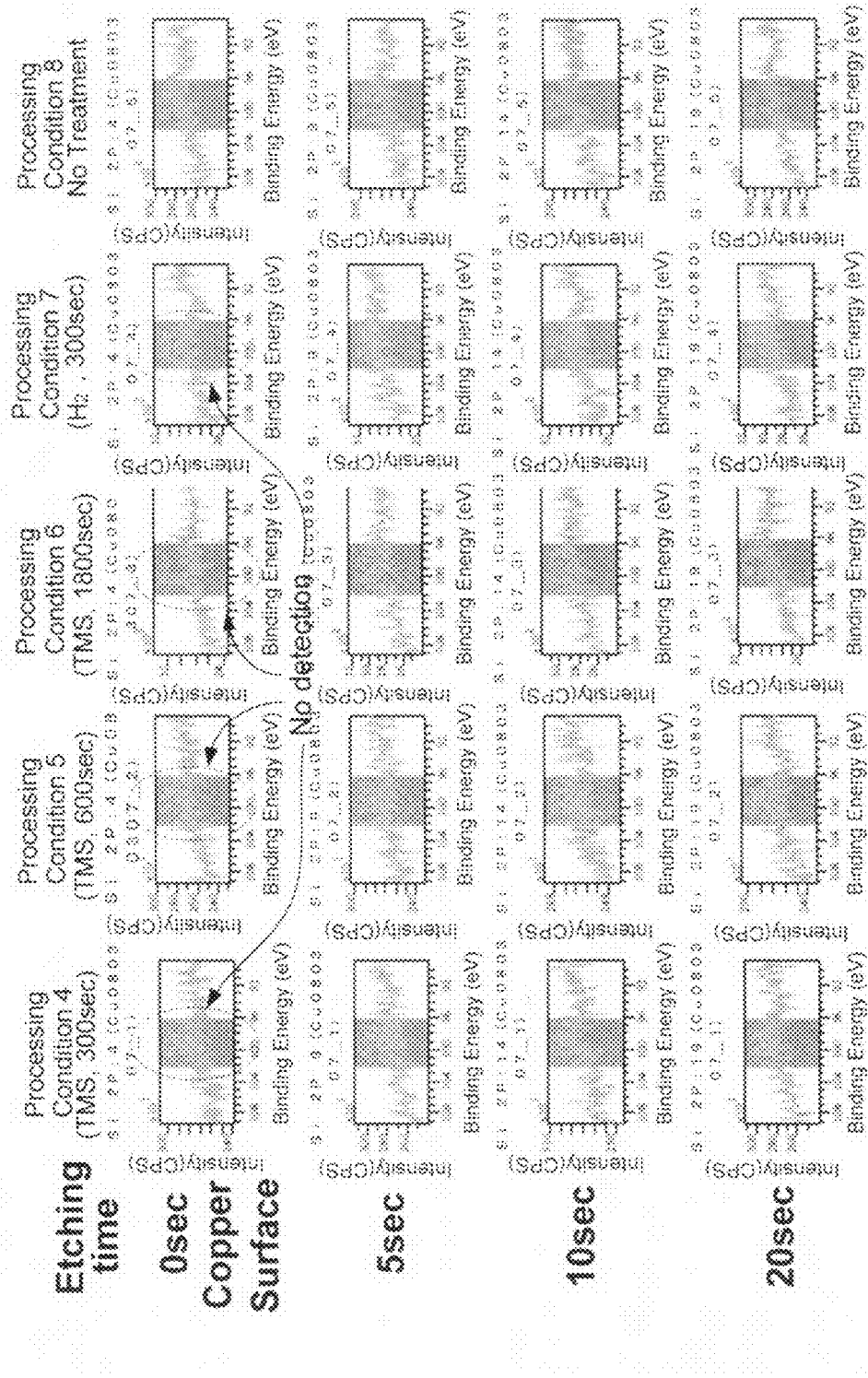
FIG. 13 illustrates results of XPS analysis where a copper oxide to which a reduction treatment was conducted is used as a sample.
Figure 14:
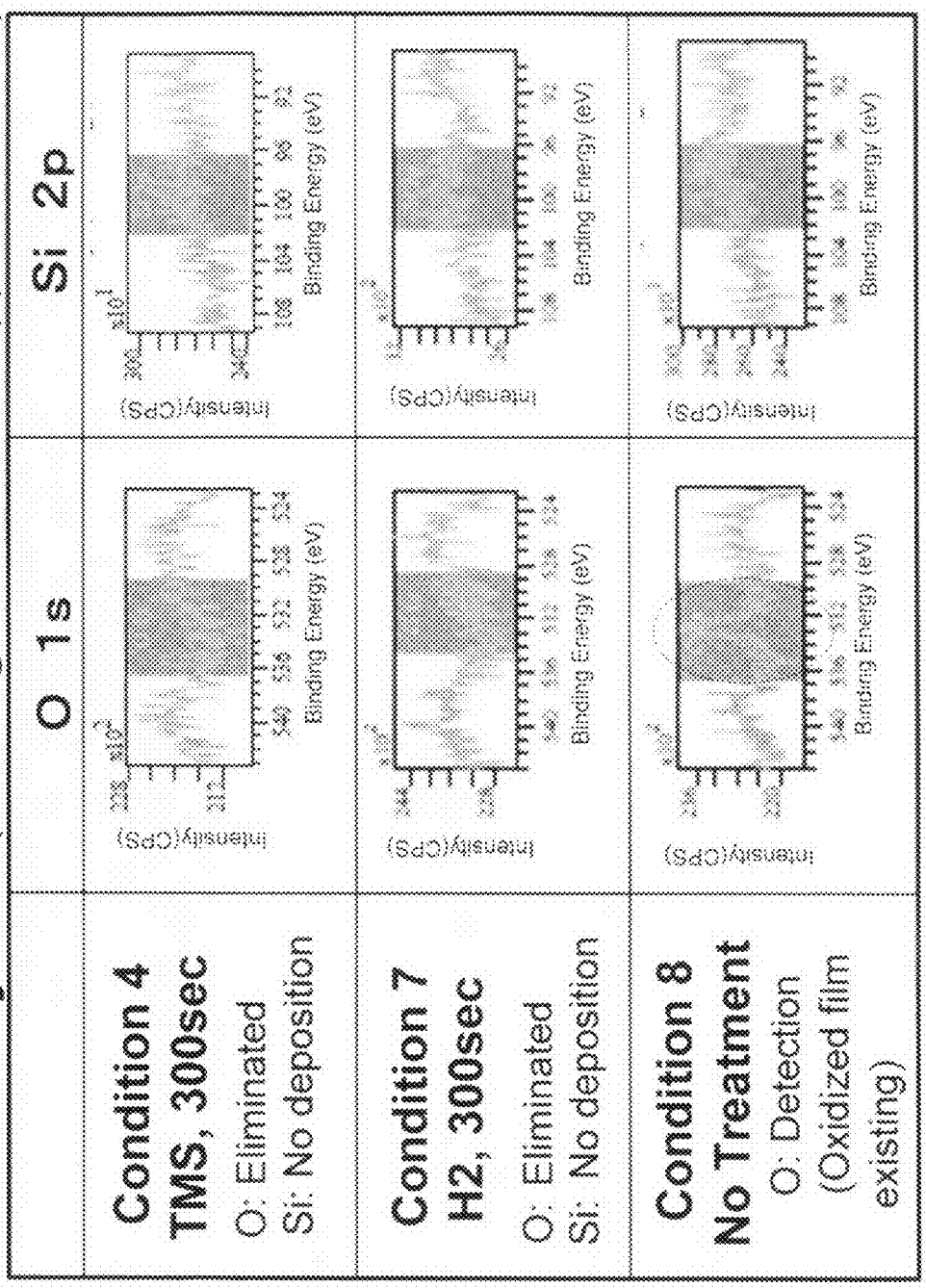
FIG. 14 illustrates results of XPS analysis where a copper oxide to which a reduction treatment was conducted is used as a sample.

Next, based on FIGS. 12 through 17, the experimental results of the oxidized copper interconnections, which were reduced by using a trimethylsilane (TMS) gas, will be explained. FIGS. 12 through 14 show the results of XPS analysis where copper oxides to which a reduction treatment was conducted were used as samples. Measurement conditions of No. 1 to 8 shown in FIGS. 12 through 14 are as shown in Table 1.

TABLE 1

| No, | Sample treatment condition for XPS analysis |
|---|---|
| 1 | STG Set Temp. 300 deg C., H2 300 sccm, 1200 m Torr, 1800 sec |
| 7 | STG Set Temp. 300 deg C., H2 300 sccm, 2000 m Torr, 300 sec |
| 2 & 3 | STG Set Temp. 300 deg C., TMS 180 sccm, Ar 100 sccm, 2000 m Torr, 1800 sec |
| 4 | STG Set Temp. 300 deg C., TMS 180 sccm, Ar 100 sccm, 2000 m Torr, 300 sec |
| 5 | STG Set Temp. 300 deg C., TMS 180 sccm, Ar 100 sccm, 2000 m Torr, 600 sec |
| 6 | STG Set Temp. 300 deg C., TMS 180 sccm, Ar 100 sccm, 2000 m Torr, 1800 sec |
| 8 | Untreated |

FIG. 12 illustrates the result of XPS (O 1s) analysis which was conducted under the sample treatment conditions No. 4 through No. 8. Referring to FIG. 12, five graphs positioned on the upper line show the measurement results about the copper surface. A portion of the five graphs is surrounded with a circle. From data regarding the portion, it was verified whether an oxidative product was existed on the sample surfaces. Under the sample treatment conditions No. 4 to No. 7, the oxidative product was not detected on the copper surfaces when a TMS gas or a hydrogen gas was used in treating the copper oxide. On the other hand, in the sample treatment condition No. 8 where any treatments were not conducted, the oxidized part was detected on the copper surface.

Meanwhile, FIG. 13 illustrates the result of XPS (Si 2p) analysis which was conducted under the sample treatment conditions No. 4 through No. 8. Referring to FIG. 13, five graphs positioned on the upper line show the measurement results on whether Si, which has the possibility to attach on the copper surface, was present or not by detecting a Si 2p spectrum. A portion of four graphs out of the five graphs is surrounded with a circle. From data regarding the portion, it can be seen that the Si 2p spectrum was not detected, and that Si, which is caused by TMS blowing, was not present on the surface of each sample.

FIG. 14 illustrates the summary of the results of XPS (O 1s) analysis and XPS (Si 2p) analysis which were conducted under the sample treatment conditions No. 4, 7, and 8. The results are the same as those described in FIGS. 12 and 13.

Figure 15:
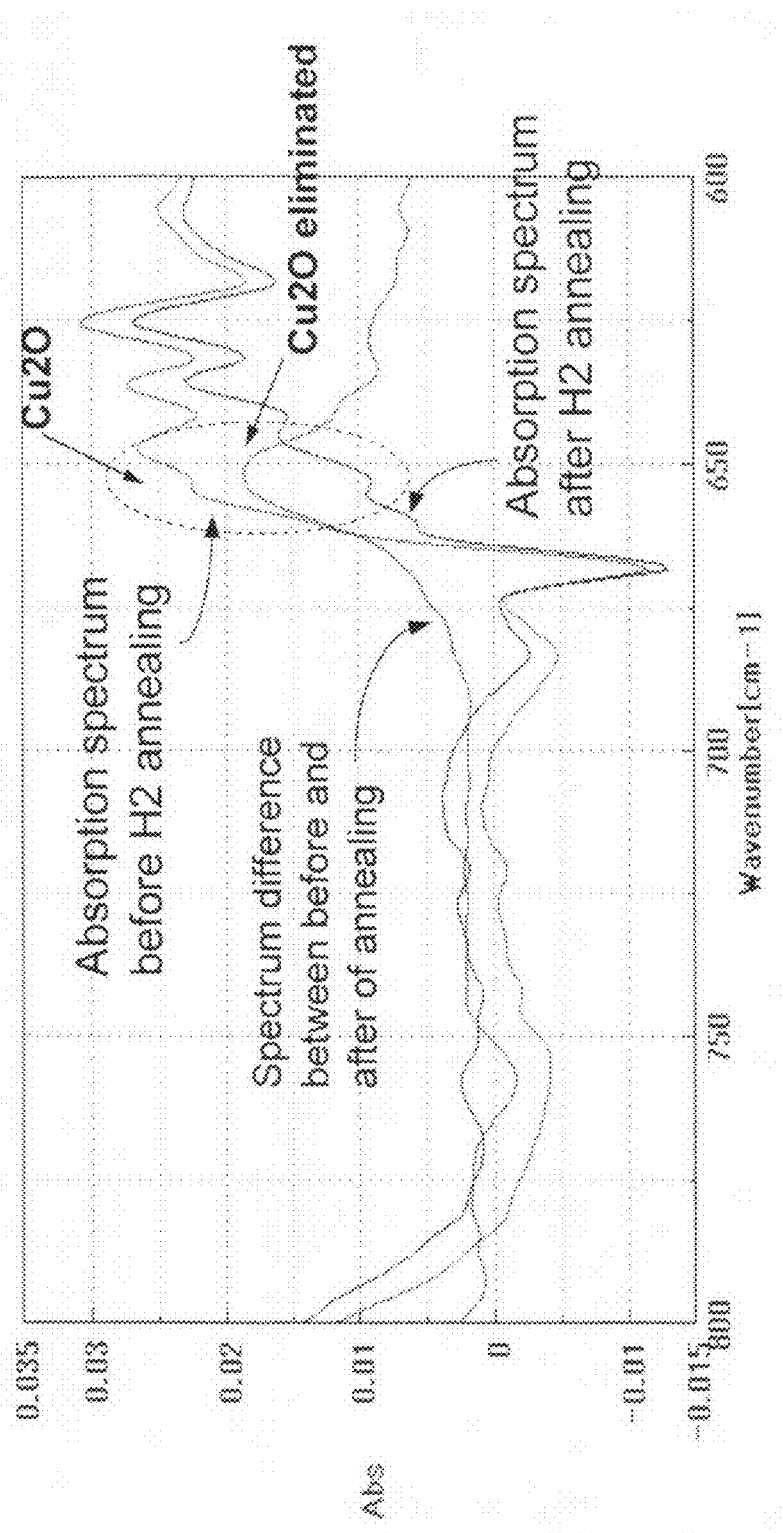
FIG. 15 illustrates results of FT-IR analysis where a copper oxide to which a reduction treatment was conducted is used as a sample.
Figure 16:
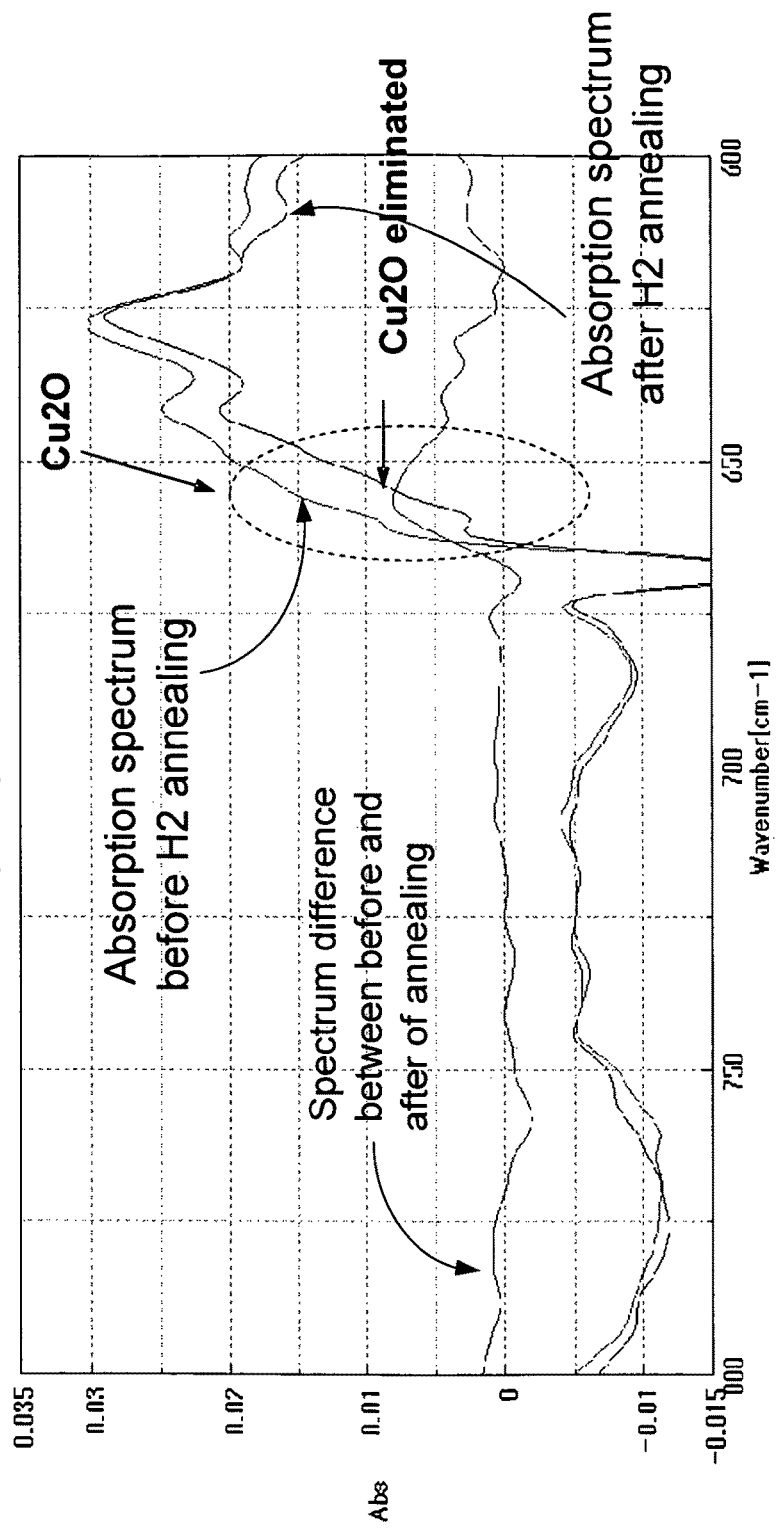
FIG. 16 illustrates results of FT-IR analysis where a copper oxide to which a reduction treatment was conducted is used as a sample.
Figure 17:
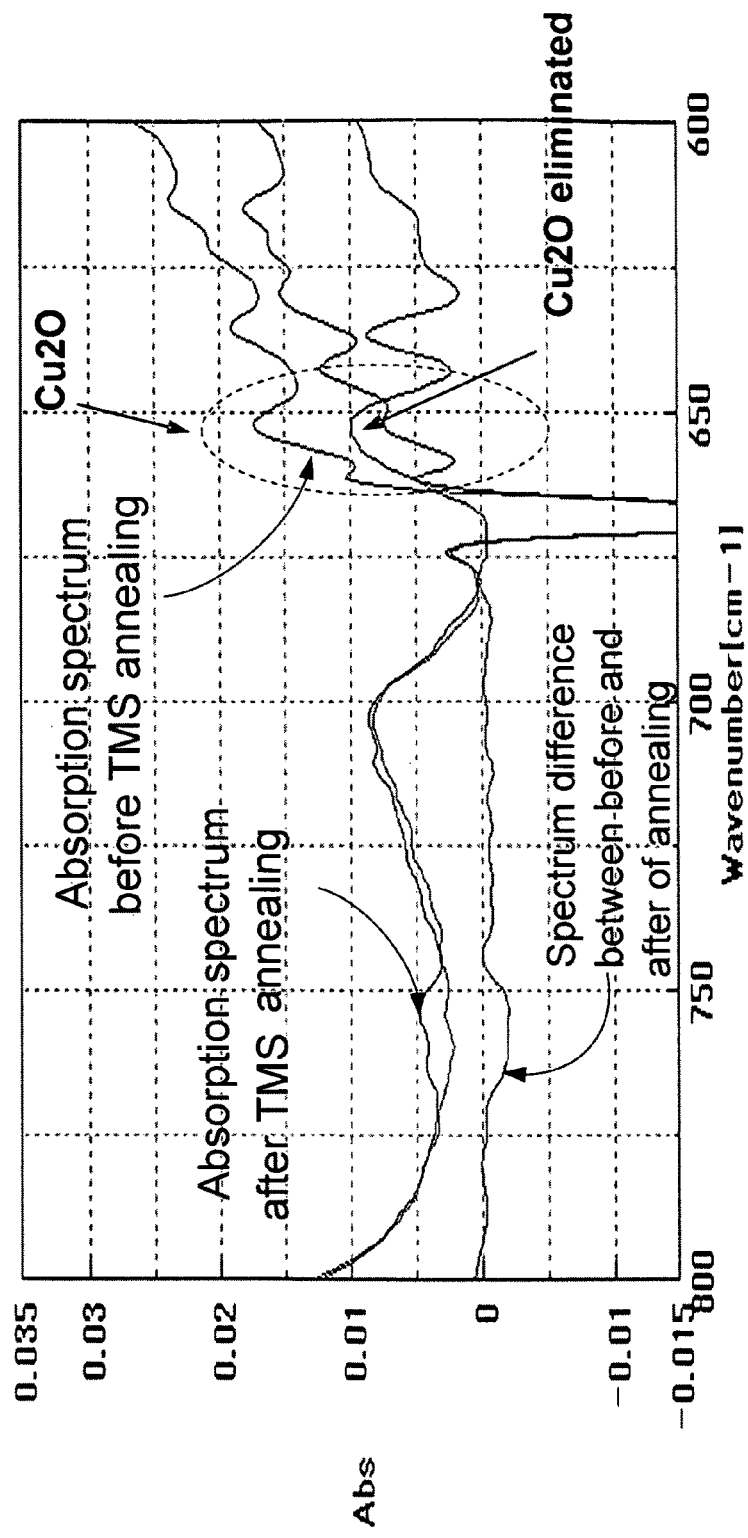
FIG. 17 illustrates results of FT-IR analysis where a copper oxide to which a reduction treatment was conducted is used as a sample.

Next, FIG. 15 through 17 will be explained. FIGS. 15 through 17 show the results of FT-IR analysis where copper oxides to which a reduction treatment was conducted were used as samples. Measurement conditions of No. 1 to 3 shown in FIGS. 15 through 17 are as shown in Table 2.

TABLE 2

| No, | Sample treatment condition for FT-IR analysis |
|---|---|
| 1 | STG Set Temp. 300 deg C., H2 300 sccm, 1200 m Torr, 1800 sec |
| 2 & 3 | STG Set Temp. 300 deg C., TMS 180 sccm, Ar 100 sccm, 2000 m Torr, 1800 sec |

Note that STG stands for substrate holding stage.

Each of FIGS. 15 through 17 illustrates an absorbing spectrum before a gas annealing treatment, an absorbing spectrum after a gas annealing treatment, and the difference spectrum between them. In referring to FIGS. 15 through 17, it can be observed commonly that there is the difference in absorption values between the absorbing spectrum before the gas annealing treatment and the absorbing spectrum after the gas annealing treatment. As the result, it can be verified that the copper oxides used as the samples were reduced by the gas annealing treatment.

While the invention has been described in detail with reference to a plurality of drawings and graphs as described above, it goes without saying that the present invention is not limited to those, and that embodiments belong to the scope of the invention as long as the embodiments have the essential part of the invention, no matter how the embodiments are put into practice.

INDUSTRIAL APPLICABILITY

Manufacturing a semiconductor device using the method described above can enable to reduce oxidized interconnections while minimizing damage to side walls of interlayer insulating films and the like in via holes and interconnection grooves as much as possible.

What is claimed is:

1. A method of manufacturing a semiconductor device having a conductor and an insulating film on a substrate, the method comprising the steps of:
    forming the conductor on the substrate and the insulating film on the conductor;
    removing the insulating film on the conductor;
    blowing an organosilane gas and a hydrogen gas to reduce an oxidized region on the conductor after removing the insulating film; and
    forming a barrier layer on the conductor after blowing the organosilane gas and the hydrogen gas, the barrier layer formed by using a gas that is different from the ones used to reduce the oxidized region;
    where the barrier layer is in direct contact with the conductor.

2. A method of claim 1, wherein the blowing step further includes a step of applying a microwave to the organosilane gas and the hydrogen gas.

3. A method of claim 1, wherein the blowing step is to blow the organosilane gas and the hydrogen gas after raising temperature of the substrate within a range from 150 to 350 degrees Celsius.

4. A method of claim 1, wherein the blowing step is to blow the organosilane gas and the hydrogen gas after raising temperature of the substrate within a range from 150 to 300 degrees Celsius.

5. A method of claim 1, wherein the blowing step includes the step of blowing the hydrogen gas after blowing the organosilane gas.

6. A method of claim 1, wherein the conductor is formed by a material including a copper.

7. A method of claim 1, wherein the insulating film is a fluorocarbon film or a SiCN film.

8. A method of claim 1, wherein the organosilane gas is a methylsilane gas.

9. A method of claim 1, wherein the organosilane gas is a trimethylsilane gas.

10. A method of manufacturing a semiconductor device having multiple layers of insulating films on a substrate, the method comprising the steps of:
    forming a conductor in the multiple layers;
    forming an opening through the multiple layers;
    reducing an oxidized part of the conductor when the conductor is oxidized by forming the opening by blowing an organosilane gas and a hydrogen gas; and
    forming a barrier layer in the opening by using a gas that is different from the ones used to reduce the oxidized region;
    wherein the barrier layer is in direct contact with the conductor.

11. A method of claim 10, wherein the barrier layer is formed by a tantalum (Ta) or/and a tantalum nitride (TaN).

12. A method of claim 10, wherein the barrier layer is formed by a titanium (Ti) or/and titanium nitride (TiN).

13. A method of claim 10, further comprising the step of:
    forming another conductor in the opening after forming the barrier layer.

14. A method of claim 10, wherein the multiple layers are made of two different kinds of insulating films.

15. A method of claim 10, wherein the organosilane gas is a trimethylsilane gas.

* * * * *